United States Patent
Liang et al.

(10) Patent No.: US 10,298,182 B1
(45) Date of Patent: *May 21, 2019

(54) RADIO FREQUENCY AMPLIFIER AND INTEGRATED CIRCUIT USING THE RADIO FREQUENCY AMPLIFIER

(71) Applicant: NATIONAL CHUNG SHAN INSTITUTE OF SCIENCE AND TECHNOLOGY, Taoyuan (TW)

(72) Inventors: Chia-Jen Liang, Kaohsiung (TW); Yen-Cheng Kuan, Kaohsiung (TW); Ching-Wen Chiang, Chiayi (TW); Hung-Ting Chou, New Taipei (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/846,719

(22) Filed: Dec. 19, 2017

(51) Int. Cl.
*H03F 3/16* (2006.01)
*H03F 1/26* (2006.01)
*H03F 3/195* (2006.01)

(52) U.S. Cl.
CPC .............. *H03F 1/26* (2013.01); *H03F 3/195* (2013.01); *H03F 2200/225* (2013.01); *H03F 2200/451* (2013.01); *H03F 2200/534* (2013.01)

(58) Field of Classification Search
CPC ........................................................ H03F 3/16
USPC .............................................. 330/277, 165, 276
See application file for complete search history.

(56) References Cited

U.S. PATENT DOCUMENTS

| | | | | |
|---|---|---|---|---|
| 3,168,707 A | * | 2/1965 | Levitt ..................... | H03F 1/52 327/526 |
| 3,348,155 A | * | 10/1967 | Von Recklinghausen ................... | H03D 7/125 327/113 |
| 3,528,023 A | * | 9/1970 | Jeffers ................. | H03F 3/1935 330/168 |
| 3,875,536 A | * | 4/1975 | Hayashi .................. | H03C 1/36 327/581 |
| 7,414,481 B2 | * | 8/2008 | Li .......................... | H03B 27/00 330/165 |
| 2014/0015614 A1 | * | 1/2014 | Oliveira ................... | H03F 1/26 330/307 |

* cited by examiner

*Primary Examiner* — Henry Choe
(74) *Attorney, Agent, or Firm* — Schmeiser, Olsen & Watts, LLP

(57) ABSTRACT

A radio frequency amplifier comprises a transistor, a transformer and a variable capacitor. The transistor has an input terminal, an output terminal and a control terminal. The transformer has a first coil conductor and a second coil conductor. The first coil conductor magnetically couples to the second coil conductor. The second coil conductor connects to the control terminal. The first coil conductor connects to the input terminal. The variable capacitor connects in parallel with the second coil conductor. An integrated circuit using the radio frequency amplifier is also introduced.

8 Claims, 4 Drawing Sheets

… (1)

RADIO FREQUENCY AMPLIFIER AND INTEGRATED CIRCUIT USING THE RADIO FREQUENCY AMPLIFIER

FIELD OF THE INVENTION

The present disclosure relates to a radio frequency amplifier and, more particularly, to a radio frequency amplifier which can be formed on an integrated circuit.

BACKGROUND OF THE INVENTION

An integrated circuit usually use a conventional radio frequency cascode amplifier as an input or output stage of the integrated circuit. However, the noise figure becomes severe as the gain improved by the conventional radio frequency cascode amplifier.

If the integrated circuit uses an amplifier, without a cascode circuit, as an input or output stage of the integrated circuit, then a gain efficiency of the amplifier may not meet the requirement. Therefore, it may be a difficult decision to make tradeoff between the gain efficiency and the noise figure when determining to use or not to use a cascode amplifier.

Further, a conventional radio frequency amplifier, with or without a cascode circuit, may not be fit in a multiband or wideband device because of the operating frequency of the conventional radio frequency amplifier is limited in a narrow range and not adjustable.

Accordingly, it is imperative to provide a radio frequency amplifier and an integrated circuit using the radio frequency amplifier which can overcome the aforesaid drawbacks of the conventional radio frequency amplifiers.

SUMMARY OF THE INVENTION

In view of the aforesaid drawbacks of the prior art, it is an objective of the present disclosure to provide a radio frequency amplifier and an integrated circuit using the radio frequency amplifier which can have a wide and adjustable operating frequency and a better gain efficiency with no or fewer noise issues.

In order to achieve the above and other objectives, the present disclosure provides a radio frequency amplifier. The radio frequency amplifier comprises a transistor, a transformer and a variable capacitor. The transistor has an input terminal, an output terminal and a control terminal. The transformer has a first coil conductor and a second coil conductor. The first coil conductor magnetically couples to the second coil conductor. The second coil conductor connects to the control terminal. The first coil conductor connects to the input terminal. The variable capacitor connects in parallel with the second coil conductor.

Regarding the radio frequency amplifier, the radio frequency amplifier further comprises a signal input end and a signal output end, wherein the signal input end connects to the input terminal of the transistor and the signal output end connects to the output terminal of the transistor.

Regarding the radio frequency amplifier, the radio frequency amplifier further comprises an inductor connected between the signal input end and the input terminal of the transistor.

Regarding the radio frequency amplifier, the radio frequency amplifier further comprises a pad capacitor connected to the signal input end.

Regarding the radio frequency amplifier, the radio frequency amplifier further comprises a bypass capacitor connected to the second coil conductor.

In order to achieve the above and other objectives, the present disclosure provides an integrated circuit. The integrated circuit comprises a signal process circuit and a radio frequency amplifier. The radio frequency amplifier is configured to connect to the signal process circuit. The radio frequency amplifier includes a transistor, a transformer and a variable capacitor. The transistor has an input terminal, an output terminal and a control terminal. The transformer has a first coil conductor and a second coil conductor. The first coil conductor magnetically couples to the second coil conductor. The second coil conductor connects to the control terminal. The first coil conductor connects to the input terminal. The variable capacitor connects in parallel with the second coil conductor.

Regarding the integrated circuit, the radio frequency amplifier further includes a signal input end and a signal output end, wherein the signal input end connects to the input terminal of the transistor, the signal output end connects to the output terminal of the transistor and an input end of the signal process circuit connecting to the signal output end of the radio frequency amplifier.

Regarding the integrated circuit, the radio frequency amplifier further includes an inductor connected between the signal input end and the input terminal of the transistor.

Regarding the integrated circuit, the radio frequency amplifier further includes a pad capacitor connected to the signal input end.

Regarding the integrated circuit, the radio frequency amplifier further includes a bypass capacitor connected to the second coil conductor.

Regarding the integrated circuit, the radio frequency amplifier is configured to be an input or output stage of the integrated circuit.

In conclusion, give the aforesaid radio frequency amplifier and integrated circuit, the present disclosure feature a wide and adjustable operating frequency and a better gain efficiency with no or fewer noise issues.

BRIEF DESCRIPTION OF THE DRAWINGS

Objectives, features, and advantages of the present disclosure are hereunder illustrated with specific embodiments in conjunction with the accompanying drawings.

DETAILED DESCRIPTION OF THE PREFERRED EMBODIMENTS

Figure 1:
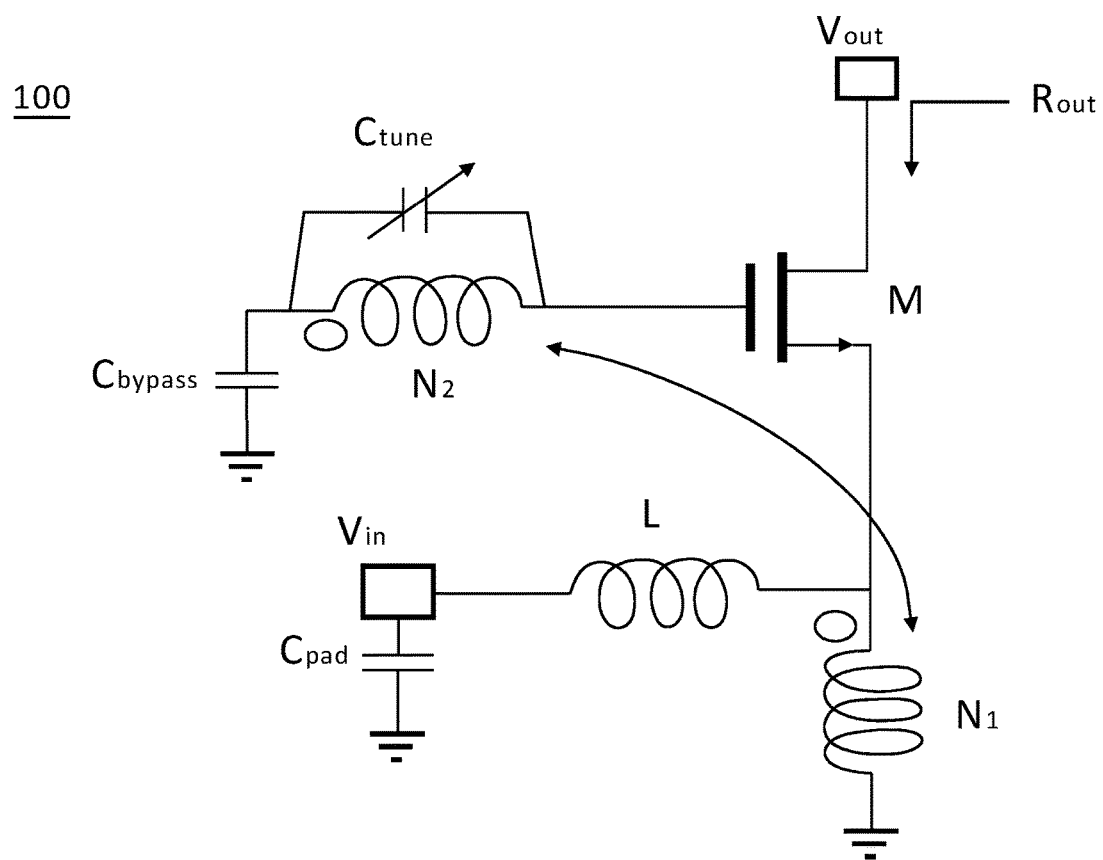
FIG. 1 shows a detailed circuit of a radio frequency amplifier according to an embodiment of the present disclosure.

Referring to FIG. 1, FIG. 1 shows a detailed circuit of a radio frequency amplifier according to an embodiment of the present disclosure.

In FIG. 1, the radio frequency amplifier 100 comprises a transistor M, a transformer (formed by the first coil conductor N1 and the second coil conductor N2) and a variable capacitor $C_{tune}$. The transformer comprises a first coil conductor N1 and a second coil conductor N2. The first coil conductor N1 and the second coil conductor N2 magnetically couple to each other to form a transformer structure.

The transistor M has an input terminal, an output terminal and a control terminal. In this embodiment, the transistor M is a MOS transistor and has a source (input terminal), a drain (output terminal) and a gate (control terminal). The output impedance $R_{out}$ of the transistor M is determined by a view from the drain of the transistor M.

The capacitance value of the variable capacitor $C_{tune}$ is adjustable. As the capacitance value of the variable capacitor $C_{tune}$ is adjusted, the magnetic flux pass through the first coil conductor N1 is changed, and thus a current value pass through the second coil conductor N2 is changed because of coupling effect.

Figure 2:
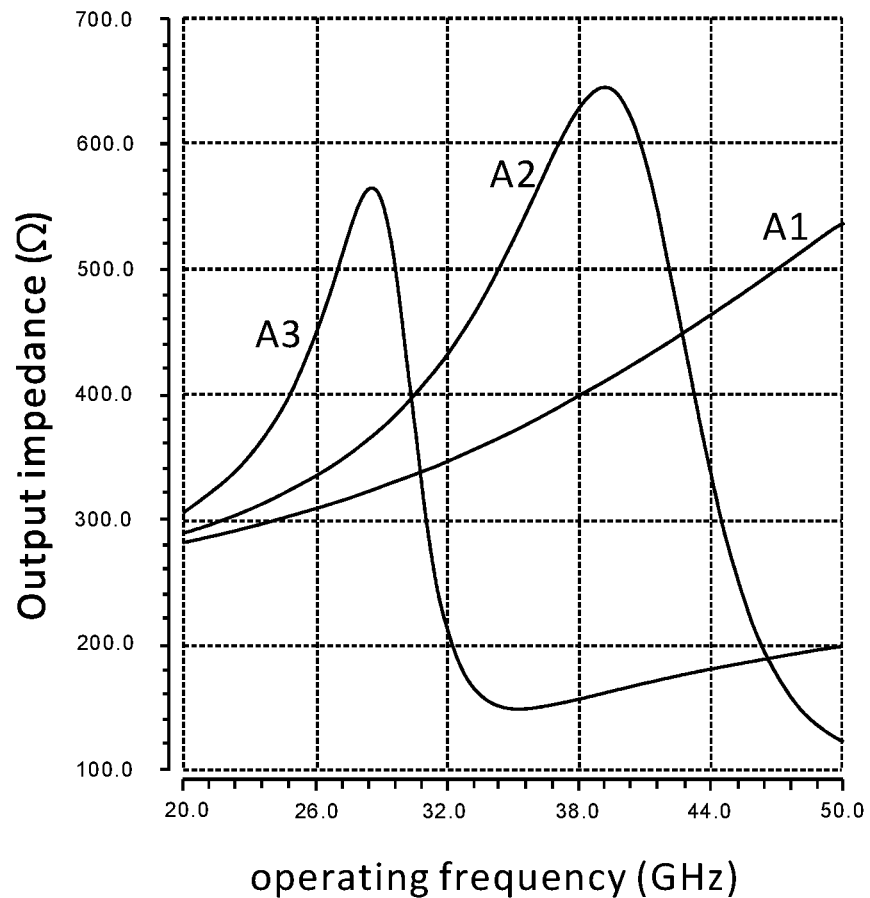
FIG. 2 shows a simulation result of a radio frequency amplifier according to an embodiment of the present disclosure.

As shown as FIG. 2, The output impedance $R_{out}$ of curve A3 is significant more than the output impedance $R_{out}$ of curve A1 when the operating frequency near 28 GHz. The output impedance $R_{out}$ of curve A2 is significant more than the output impedance $R_{out}$ of curve A1 when the operating frequency near 38 GHz. The curve A1 is a simulation result given that the variable capacitor $C_{tune}$ is not used. The curve A2 and A3 are a simulation results given that the variable capacitance $C_{tune}$ is used. Obviously, the usage and adjustment of the variable capacitance $C_{tune}$ improve the output impedance $R_{out}$ of the radio frequency amplifier 100 at a certain operating frequency.

As the output impedance $R_{out}$ of the radio frequency amplifier 100 increases at the certain operating frequency, the anti-noise ability of the radio frequency amplifier 100 improves. Furthermore, the certain operating frequency corresponding to the maximum output impedance $R_{out}$ can be tuned by adjusting the capacitance of the variable capacitance $C_{tune}$, and thus the radio frequency amplifier 100 can fit in a multiband or wideband device, for example, a radio transceiver. The operator can adjust the variable capacitor $C_{tune}$ until a curve of the output impedance $R_{out}$ is optimized, for instance, maximizing the output impedance $R_{out}$ at the desired operating frequency range.

Figure 3:
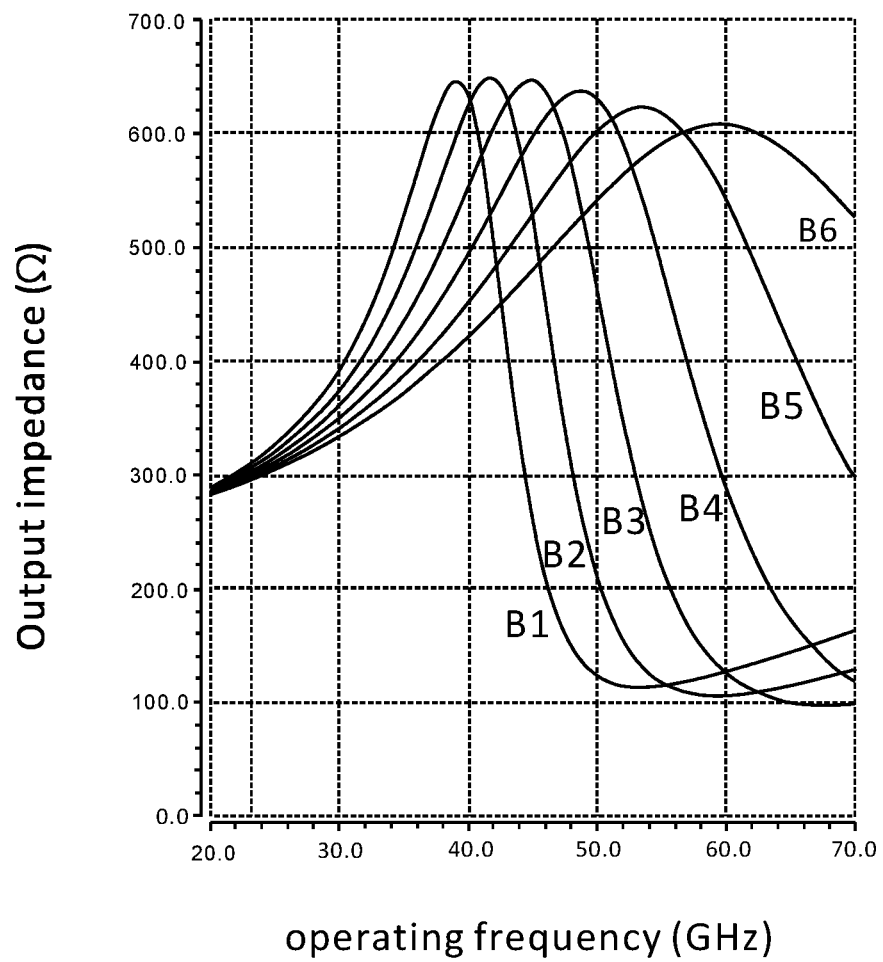
FIG. 3 shows another one simulation result of a radio frequency amplifier according to an embodiment of the present disclosure.

FIG. 3 shows another one simulation result of a radio frequency amplifier according to an embodiment of the present disclosure. In FIG. 3, the value of the output impedance $R_{out}$ of curves B1-B6 is maximized at different operating frequencies.

The value of the output impedance $R_{out}$ of curves B1 is maximized when the operating frequency is approximate to 38 GHz. The value of the output impedance $R_{out}$ of curves B2 is maximized when the operating frequency is approximate to 42 GHz. The value of the output impedance $R_{out}$ of curves B3 is maximized when the operating frequency is approximate to 44 GHz. The value of the output impedance $R_{out}$ of curves B4 is maximized when the operating frequency is approximate to 48 GHz. The value of the output impedance $R_{out}$ of curves B5 is maximized when the operating frequency is approximate to 53 GHz. The value of the output impedance $R_{out}$ of curves B6 is maximized when the operating frequency is approximate to 59 GHz. FIG. 3 further proves that the radio frequency amplifier 100 can fit in a multiband or wideband device.

Referring back to FIG. 1, the radio frequency amplifier 100 further comprises (but can be modified, eliminated or substituted in other embodiment) a signal input end $V_{in}$, a signal output end $V_{out}$, an inductor L, a pad capacitance $C_{pad}$ and a bypass capacitance $C_{bypass}$.

The signal input end $V_{in}$ connects to the source (input terminal) of the transistor M. The signal output end $V_{out}$ connects to the drain (output terminal) of the transistor M. The inductor L connects between the signal input end $V_{in}$ and the source (input terminal) of the transistor M. The pad capacitance $C_{pad}$ connected to the signal input end $V_{in}$. The bypass capacitance $C_{bypass}$ connected to the second coil conductor N2.

Figure 4:
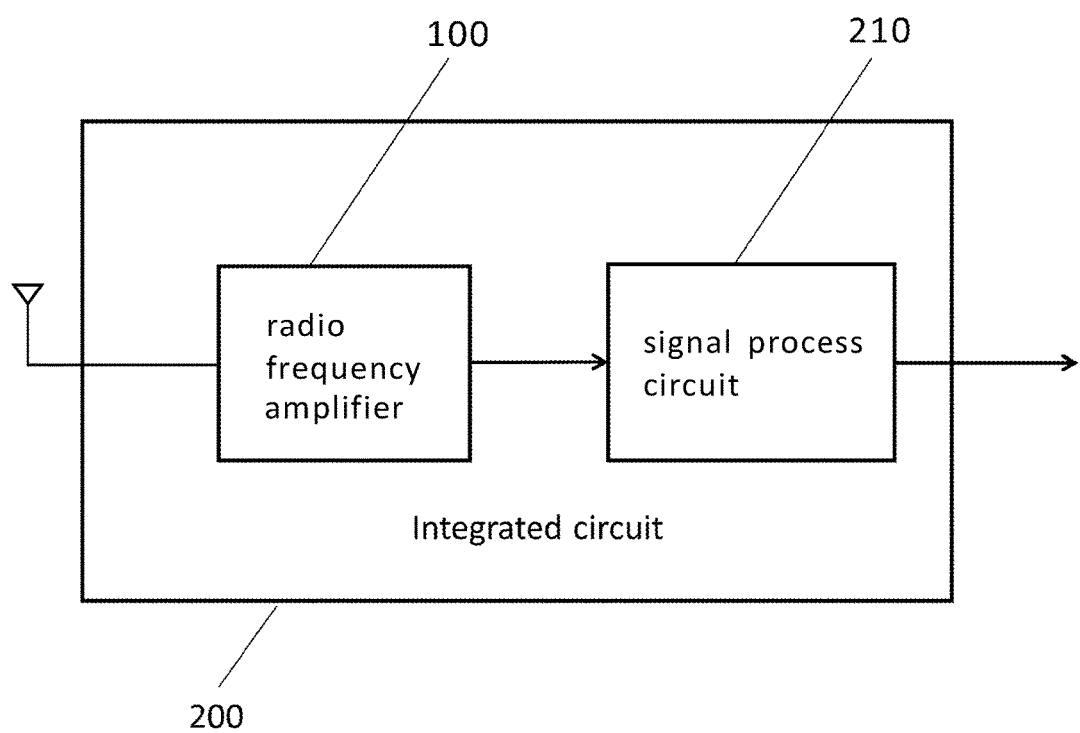
FIG. 4 is a schematic diagram of an integrated circuit according to an embodiment of the present disclosure.

Referring to FIG. 4, FIG. 4 is a schematic diagram of an integrated circuit according to an embodiment of the present disclosure.

In FIG. 4, the radio frequency amplifier 100 is formed on an integrated circuit 200. The integrated circuit 200 further comprises a signal process circuit 210. The input end of the signal process circuit 210 connects to the signal output end $V_{out}$ of the integrated circuit 200. Therefore, after being processed by radio frequency amplifier 100, a processed signal as an input signal is transmitted to the signal process circuit 210. The radio frequency amplifier 100 can amplified the input signal before the signal input to the signal process circuit 210.

The radio frequency amplifier 100, which can be implemented without using a cascode circuit, can be configured to act as an input or output stage of the integrated circuit 200 (as an input stage in FIG. 4). Therefore, the radio frequency amplifier 100 can overcome the drawbacks of the conventional radio frequency cascode amplifiers. For example, the radio frequency amplifier 100 has no noise issue or fewer noise issues than the conventional radio frequency cascode amplifiers. The radio frequency amplifier 100 can also overcome the drawbacks of conventional radio frequency amplifiers without using a cascode circuit. For example, the radio frequency amplifier 100 has a better gain efficiency than the conventional radio frequency amplifiers without using a cascode circuit.

In conclusion, giving the aforesaid radio frequency amplifier and integrated circuit, the present disclosure features a wide and adjustable operating frequency and a better gain efficiency with no or fewer noise issues.

The present disclosure is disclosed above by preferred embodiments. However, persons skilled in the art should understand that the preferred embodiments are illustrative of the present disclosure only, but should not be interpreted as restrictive of the scope of the present disclosure. Hence, all equivalent modifications and replacements made to the aforesaid embodiments should fall within the scope of the present disclosure. Accordingly, the legal protection for the present disclosure should be defined by the appended claims.

What is claimed is:

1. A radio frequency amplifier comprising:
    a transistor having an input terminal, an output terminal and a control terminal;
    a transformer having a first coil conductor and a second coil conductor, the first coil conductor magnetically coupling to the second coil conductor, the second coil conductor connecting to the control terminal, the first coil conductor connecting to the input terminal;
    a variable capacitor connected in parallel with the second coil conductor;
    a signal input end and a signal output end, wherein the signal input end connects to the input terminal of the transistor and the signal output end connects to the output terminal of the transistor; and
    an inductor connected between the signal input end and the input terminal of the transistor.

2. The radio frequency amplifier of claim 1 further comprising a pad capacitor connected to the signal input end.

3. The radio frequency amplifier of claim 2 further comprising a bypass capacitor connected to the second coil conductor.

4. The radio frequency amplifier of claim 1 further comprising a bypass capacitor connected to the second coil conductor.

5. An integrated circuit comprising:

a signal process circuit; and a radio frequency amplifier configured to connect to the signal process circuit, the radio frequency amplifier including a transistor, a transformer and a variable capacitor, the transistor having an input terminal, an output terminal and a control terminal, the transformer having a first coil conductor and a second coil conductor, the first coil conductor magnetically coupling to the second coil conductor, the second coil conductor connecting to the control terminal, the first coil conductor connecting to the input terminal, the variable capacitor connecting in parallel with the second coil conductor;

wherein the radio frequency amplifier further includes a signal input end and a signal output end, the signal input end connects to the input terminal of the transistor, the signal output end connects to the output terminal of the transistor, and an input end of the signal process circuit connects to the signal output end of the radio frequency amplifier;

wherein the radio frequency amplifier further includes an inductor connected between the signal input end and the input terminal of the transistor.

6. The integrated circuit of claim 5, wherein the radio frequency amplifier further includes a pad capacitor connected to the signal input end.

7. The integrated circuit of claim 6, wherein the radio frequency amplifier further includes a bypass capacitor connected to the second coil conductor.

8. The integrated circuit of claim 5, wherein the radio frequency amplifier further includes a bypass capacitor connected to the second coil conductor.

\* \* \* \* \*